United States Patent
Hirota

(10) Patent No.: US 8,293,560 B2
(45) Date of Patent: *Oct. 23, 2012

(54) METHOD OF MANUFACTURING PHOTOELECTRIC CONVERSION DEVICE

(75) Inventor: Katsunori Hirota, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/172,768

(22) Filed: Jun. 29, 2011

(65) Prior Publication Data

US 2011/0256660 A1 Oct. 20, 2011

Related U.S. Application Data

(63) Continuation of application No. 12/777,974, filed on May 11, 2010, now Pat. No. 7,993,953.

(30) Foreign Application Priority Data

Jun. 8, 2009 (JP) .................................. 2009-137719

(51) Int. Cl.
*H01L 21/00* (2006.01)
*H01L 31/0232* (2006.01)

(52) U.S. Cl. ....... 438/60; 438/69; 438/72; 257/E31.097; 257/E31.127

(58) Field of Classification Search .............. 438/60, 438/69, 72
See application file for complete search history.

(56) References Cited

U.S. PATENT DOCUMENTS

| | | | |
|---|---|---|---|
| 7,312,098 B2 | 12/2007 | Kimura | |
| 7,476,560 B2 | 1/2009 | Yuzurihara | |
| 7,993,953 B2 * | 8/2011 | Hirota | 438/60 |
| 2007/0092986 A1 | 4/2007 | Chen | |
| 2008/0131990 A1 | 6/2008 | Jung | |
| 2008/0230110 A1 | 9/2008 | Freedman | |
| 2009/0035887 A1 | 2/2009 | Suzuki | |
| 2009/0289282 A1 | 11/2009 | Tsuno | |
| 2010/0026866 A1 | 2/2010 | Matsumoto | |
| 2010/0243864 A1 | 9/2010 | Itonaga | |

FOREIGN PATENT DOCUMENTS

| | | |
|---|---|---|
| JP | 3-181171 | 8/1991 |
| JP | 2006-73611 | 3/2006 |
| JP | 2007-67325 | 3/2007 |

* cited by examiner

*Primary Examiner* — Alexander Ghyka
(74) *Attorney, Agent, or Firm* — Fitzpatrick, Cella, Harper & Scinto

(57) ABSTRACT

A method of manufacturing a photoelectric conversion device, comprises forming a first insulating film on a semiconductor substrate, forming a gate electrode by forming an electrically conductive layer on the first insulating film and patterning the electrically conductive layer, etching an exposed surface of the first insulating film, forming a charge accumulation region of a photoelectric converter by implanting impurity ions of a first conductivity type into the semiconductor substrate through a thinned portion of the first insulating film formed by the etching, removing the thinned portion, forming a second insulating film covering the semiconductor substrate and the gate electrode, and forming a surface region of the photoelectric converter by implanting impurity ions of a second conductivity type opposite to the first conductivity type into the semiconductor substrate through the second insulating film.

13 Claims, 2 Drawing Sheets

METHOD OF MANUFACTURING PHOTOELECTRIC CONVERSION DEVICE

This application is a continuation of application Ser No. 12/777,974, filed May 11, 2010 (pending).

BACKGROUND OF THE INVENTION

1. Field of the Invention

The present invention relates to a method of manufacturing a photoelectric conversion device.

2. Description of the Related Art

Japanese Patent Laid-Open No. 2006-73611 describes a method of manufacturing a solid-state image sensing device, which includes forming the n-type region (charge accumulation region) of a photodiode A1 by ion implantation. More specifically, a gate oxide film 102 and a polysilicon film 103 are sequentially formed on an n-type silicon substrate 101. A first photoresist pattern 105 is formed on the polysilicon film 103. Using the first photoresist pattern 105 as a mask, the gate oxide film 102 and the polysilicon film 103 are etched to expose the n-type silicon substrate 101, thereby forming a gate electrode pattern. Next, a second photoresist pattern 106 is formed without removing the first photoresist pattern 105. Ion implantation is performed using the second photoresist pattern 106 as a mask, thereby forming an n-type region 107 of the photodiode A1 in the well of the n-type silicon substrate 101.

Japanese Patent Laid-Open No. 2006-73611 describes forming the n-type region (charge accumulation region) 107 of the photodiode A1 by performing ion implantation while exposing a surface region of the semiconductor substrate where the photodiode A1 should be formed. However, when ion implantation is done while exposing the region to form the photodiode A1, damage or metal contamination occurs due to the ion implantation.

On the other hand, Japanese Patent Laid-Open No. 2006-73611 makes no disclosure about surface region formation in the photoelectric converter by ion implantation through an insulating film that covers the surface of the semiconductor substrate. There is no disclosure about how to suppress a variation in the implantation profile of the surface region in the photoelectric converter upon ion implantation through the insulating film, either.

SUMMARY OF THE INVENTION

The present invention provides a technique advantageous for suppressing a variation in the implantation profile of a surface region in a photoelectric converter upon ion implantation through an insulating film.

One of the aspects of the present invention provides a method of manufacturing a photoelectric conversion device, the method comprising: a first step of forming a first insulating film on a semiconductor substrate; a second step of forming a gate electrode by forming an electrically conductive layer on the first insulating film and patterning the electrically conductive layer; a third step of etching an exposed surface of the first insulating film; a forth step of forming a charge accumulation region of a photoelectric converter by implanting impurity ions of a first conductivity type into the semiconductor substrate through a thinned portion of the first insulating film formed by the etching; a fifth step of removing the thinned portion after the fourth step; a sixth step of forming a second insulating film covering the semiconductor substrate and the gate electrode; and a seventh step of forming a surface region of the photoelectric converter by implanting impurity ions of a second conductivity type opposite to the first conductivity type into the semiconductor substrate through the second insulating film.

Further features of the present invention will become apparent from the following description of exemplary embodiments with reference to the attached drawings.

DESCRIPTION OF THE EMBODIMENTS

A method of manufacturing a photoelectric conversion device 200 according to an embodiment of the present invention will be described with reference to FIGS. 1A to 1J.

Figure 1A:
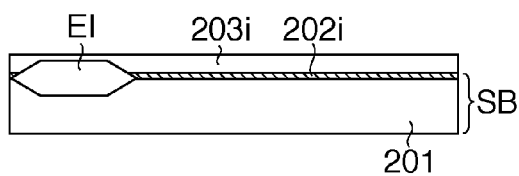
FIGS. 1A to 1J are sectional views showing steps in a method of manufacturing a photoelectric conversion device 200 according to an embodiment.

In the step shown in FIG. 1A, a semiconductor substrate SB is prepared. The semiconductor substrate SB includes a well region 201 containing an impurity of, for example, a first conductivity type (for example, n type) at a low concentration. The semiconductor substrate SB is, for example, thermally oxidized to form a first insulating film 202$i$ on the semiconductor substrate SB (first step) and also form an element isolating portion EI in the semiconductor substrate SB. The first insulating film 202$i$ is made of, for example, silicon oxide. The element isolating portion EI is made of, for example, silicon oxide. An electrically conductive layer 203$i$ is formed on the first insulating film 202$i$ (second step). The electrically conductive layer 203$i$ is made of, for example, polysilicon.

Figure 1F:
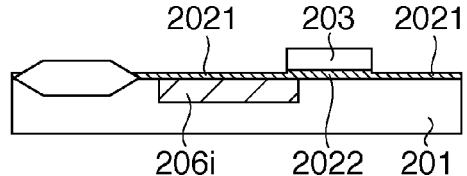
Figure 1B:
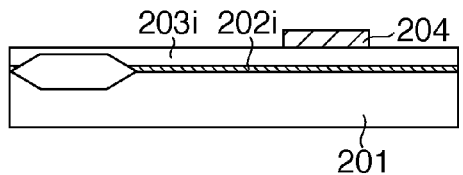

In the step shown in FIG. 1B, a resist pattern 204 is formed on the electrically conductive layer 203$i$ to selectively cover a region where a gate electrode 203 should be arranged (second step). The resist pattern 204 is formed by, for example, coating the surface with a resist and then patterning it by exposure and development.

Figure 1G:
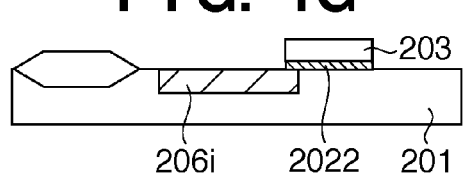
Figure 1C:
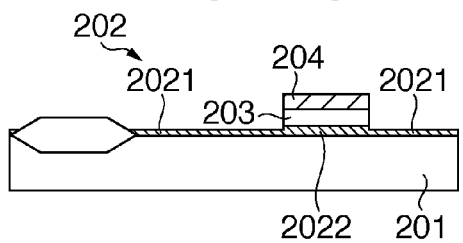

In the step shown in FIG. 1C, first, the electrically conductive layer 203$i$ is etched using the resist pattern 204 as a mask, thereby forming the gate electrode 203 (second step). That is, the gate electrode 203 is formed by patterning the electrically conductive layer 203$i$. The gate electrode 203 is the gate electrode of a transistor that transfers charges generated in a photoelectric converter PD to a charge-voltage converter (not shown). The charge-voltage converter converts the transferred charges into a voltage. The charge-voltage converter is, for example, a floating diffusion. An output unit (not shown) outputs a signal corresponding to the voltage of the charge-voltage converter to a signal line. The output unit is, for example, an amplifier transistor.

Using the resist pattern 204 and optionally further using the gate electrode 203, as a mask, the exposed surface of the first insulating film 202$i$ is etched. The first insulating film 202$i$ is thus converted into a first insulating film 202 including a first portion 2021 thinned by etching and an unetched second portion 2022. The first portion 2021 is a portion of the first insulating film 202 arranged around the gate electrode 203. The second portion 2022 is a portion of the first insulating film 202 arranged under the gate electrode 203. The thickness of the second portion 2022 almost equals that of the first insulating film 202$i$ before etching. The first portion 2021 is thinner than the first insulating film 202$i$ before etching and also thinner than the second portion 2022. The thickness of the first portion 2021 is, for example, several nm. The first portion 2021 and the second portion 2022 are made of the same material as that of the first insulating film 202i, for example, silicon oxide. The etching or patterning of the electrically conductive layer 203i and the etching of the first insulating film 202i can be sequentially performed, using the resist pattern 204, under the same etching condition.

Figure 1H:
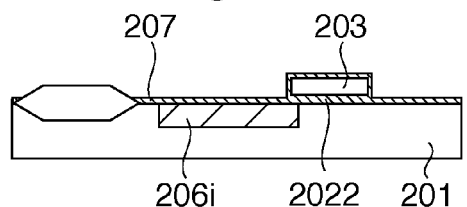
Figure 1D:
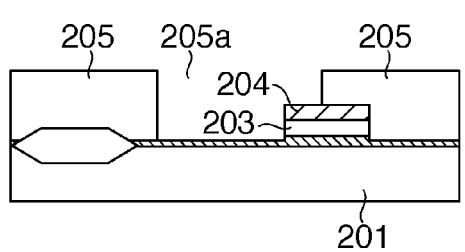

In the step shown in FIG. 1D, a resist pattern 205 is formed without removing the resist pattern 204. More specifically, the resist pattern 205 having an opening 205a in a region where the photoelectric converter PD should be arranged is formed to cover the first portion 2021 and the resist pattern 204. The resist pattern 205 is formed by, for example, coating the surface with a resist and then patterning it by exposure and development.

Figure 1I:
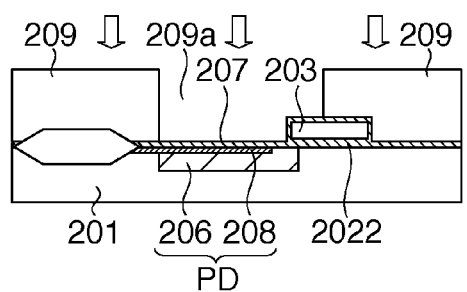
Figure 1E:
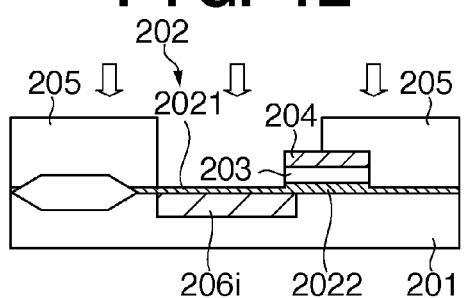

In the step (fourth step) shown in FIG. 1E, impurity ions of the first conductivity type (for example, n type) are implanted into the semiconductor substrate SB through the first portion 2021 of the first insulating film 202 formed in the third step using the resist patterns 205 and 204 as a mask. That is, ion implantation is performed using the first portion 2021 as a buffer film. A semiconductor region 206i that is a prospective charge accumulation region 206 of the photoelectric converter PD is thus formed in the region where the photoelectric converter PD should be arranged. The semiconductor region 206i contains an impurity of the first conductivity type (for example, n type) at a concentration higher than that in the well region 201.

The ion implantation is done by implanting phosphorus or arsenic ions at an energy to obtain a range of 0.5 to 1.5 μm. The dose is preferably $1 \times 10^{12}$ to $1 \times 10^{13}$ (cm$^{-2}$). To efficiently transfer charges from the photoelectric converter PD to the charge-voltage converter, part of the semiconductor region 206i is preferably arranged under the gate electrode 203 and the second portion 2022 by implanting the ions at a tilt angle.

In the step shown in FIG. 1F, the resist patterns 205 and 204 are removed. For example, the resist patterns 205 and 204 are peeled using sulfuric acid.

In the step (fifth step) shown in FIG. 1G, the first portion 2021 is selectively removed. The first portion 2021 is removed by, for example, anisotropic dry etching.

Note that the first portion 2021 may be removed by, for example, wet etching using a chemical solution. Examples of the chemical solution are hydrofluoric acid (HF), buffered hydrofluoric acid (HF/NH$_4$F), and ammonium fluoride (NH$_4$F). This can avoid plasma damage to the surface of the semiconductor substrate SB and, more particularly, the surface of the semiconductor region 206i that is the prospective photoelectric converter PD.

In the step (sixth step) shown in FIG. 1H, a second insulating film 207 is formed by, for example, thermal oxidation or radical oxidation to cover the semiconductor substrate SB and the gate electrode 203. The thickness of the second insulating film 207 is, for example, several to several ten nm. More specifically, the second insulating film 207 is preferably 3 to 10 nm thick. The second insulating film 207 is made of, for example, silicon oxide.

In the step shown in FIG. 1I, a resist pattern 209 having an opening 209a in the region where the photoelectric converter PD should be arranged is formed to cover the semiconductor substrate SB and the second insulating film 207. The resist pattern 209 is formed by, for example, coating the surface with a resist and then patterning it by exposure and development.

Then (in the seventh step), impurity ions of a second conductivity type are implanted into the semiconductor substrate SB through the second insulating film 207 using the resist pattern 209 as a mask. The second conductivity type is opposite to the first conductivity type. That is, ion implantation is performed using the second insulating film 207 as a buffer film. A surface region 208 of the photoelectric converter PD is thus formed. Additionally, a region of the semiconductor region 206i under the surface region 208 is converted into the charge accumulation region 206 of the photoelectric converter PD. The photoelectric converter PD generates and accumulates charges corresponding to light. The surface region 208 protects the charge accumulation region 206 to suppress a dark current in the charge accumulation region 206. The charge accumulation region 206 accumulates the generated charges.

The ion implantation is done by implanting boron or boron fluoride ions at a dose of 1E13 to 1E14 (cm$^{-2}$) at an energy to obtain a range near the interface between the second insulating film 207 and the semiconductor substrate. To efficiently transfer charges from the photoelectric converter PD to the charge-voltage converter, the surface region 208 is preferably formed by implanting the ions at a tilt angle from the upper side of the gate electrode 203 toward the semiconductor region 206i.

Figure 1J:
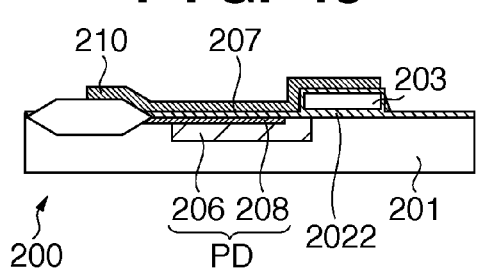

In the step shown in FIG. 1J, an insulating film 210 is formed to cover the portion of the second insulating film 207, which is arranged on the photoelectric converter PD and the gate electrode 203. The insulating film 210 functions as an anti-reflection film that reduces light reflection in the photoelectric converter PD. This can improve the sensitivity of the photoelectric converter PD. The insulating film 210 preferably has a thickness that minimizes reflection of green light having a wavelength of 550 nm in the photoelectric converter PD. The thickness of the insulating film 210 is, for example, 40 to 50 nm.

To operate the photoelectric conversion device 200 at low noise, the photoelectric converter PD needs to be depleted. More specifically, when applying a voltage to the gate electrode 203 to transfer charges accumulated in the charge accumulation region 206 to the charge-voltage converter, the whole region of the charge accumulation region 206 is preferably depleted. The voltage supplied to the gate electrode 203 for depleting almost the whole region of the charge accumulation region 206 will be referred to as a depletion voltage. The amount of charges that can be accumulated in the charge accumulation region 206 upon applying the depletion voltage determines the saturated charge amount of the photoelectric converter. The depletion voltage changes depending on, for example, the impurity concentration of the surface region 208 or the depth and area of the implantation profile. Especially, the implantation profile of the surface region 208 most largely influences the depletion voltage. If it is possible to uniform the depletion voltage of the photoelectric converter PD in the photoelectric conversion device 200, the saturated charge amount of the photoelectric converter PD in the photoelectric conversion device 200 can easily be improved. That is, to improve the saturated charge amount of the photoelectric converter PD, it is necessary to suppress the variation in the implantation profile of the surface region 208.

Assume that the first portion 2021 is left without removing it in the step shown in FIG. 1F. The first portion 2021 is formed by etching the surface of the first insulating film 202i in the step shown in FIG. 1C. The etching amount tends to vary within the plane of the semiconductor substrate SB depending on the state of the etching apparatus. More specifically, when a plurality of photoelectric conversion devices are formed on the semiconductor substrate SB, the etching amount varies between the plurality of photoelectric conversion devices. In addition, when a plurality of photoelectric converters are formed in a photoelectric conversion device, the etching amount varies between the plurality of photoelectric converters. This makes the thickness of the first portion 2021 that covers the plurality of photoelectric converters varies between the plurality of photoelectric converters. In this case, in the step shown in FIG. 1I, the impurity ions of a second conductivity type are implanted into the semiconductor substrate SB through the first portion 2021 whose thickness varies between the plurality of photoelectric converters. As a result, the implantation profile of the surface region 208 largely varies between the plurality of photoelectric converters.

In addition, the first portion 2021 captures metal impurities mixed upon ion implantation for forming the charge accumulation region 206. The metal impurities captured by the first portion 2021 may be discharged to the charge accumulation region 206 by the knock-on phenomenon at the time of ion implantation for forming the surface region 208. If the charge accumulation region 206 contains the metal impurities, a dark current caused by the metal impurities is generated in the photoelectric converter PD. As a result, an image obtained in accordance with charges generated in the photoelectric converter PD contains white spots. Since even a slight error in the output signal largely influences the image, metal contamination is a serious problem in the photoelectric conversion device.

In this embodiment, however, after the first portion 2021 is removed in the step shown in FIG. 1F, the second insulating film 207 that covers the semiconductor substrate SB and the gate electrode 203 is formed in the step shown in FIG. 1H. The variation in the thickness of the formed second insulating film 207 within the plane of the semiconductor substrate SB is smaller than that in the first portion 2021. In the step shown in FIG. 1I, the impurity ions of a second conductivity type are implanted into the semiconductor substrate SB through the second insulating film 207 whose thickness variation between the plurality of photoelectric converters is small. It is consequently possible to suppress the variation in the implantation profile of the surface region 208 in the photoelectric converter PD. That is, according to the embodiment, it is possible to suppress the variation in the implantation profile of the surface region in the photoelectric converter upon ion implantation through the insulating film. The second insulating film 207 is thicker than the first portion 2021. For this reason, performing ion implantation through the second insulating film 207 in the step shown in FIG. 1I allows to easily form the surface region 208 at a shallow position in the semiconductor substrate SB as compared to ion implantation through the first portion 2021.

Furthermore, since the first portion 2021 is removed in the step shown in FIG. 1F, mixing of metal impurities in the semiconductor substrate SB can be reduced in the step shown in FIG. 1I.

As described above, according to this embodiment, it is possible to obtain a photoelectric conversion device which has a uniform implantation profile of the surface region, and reduces mixing of metal impurities in the semiconductor substrate. The photoelectric conversion device obtained by this method reduces the dark current or defective pixels, and has a uniform and large saturated charge amount.

Figure 2:
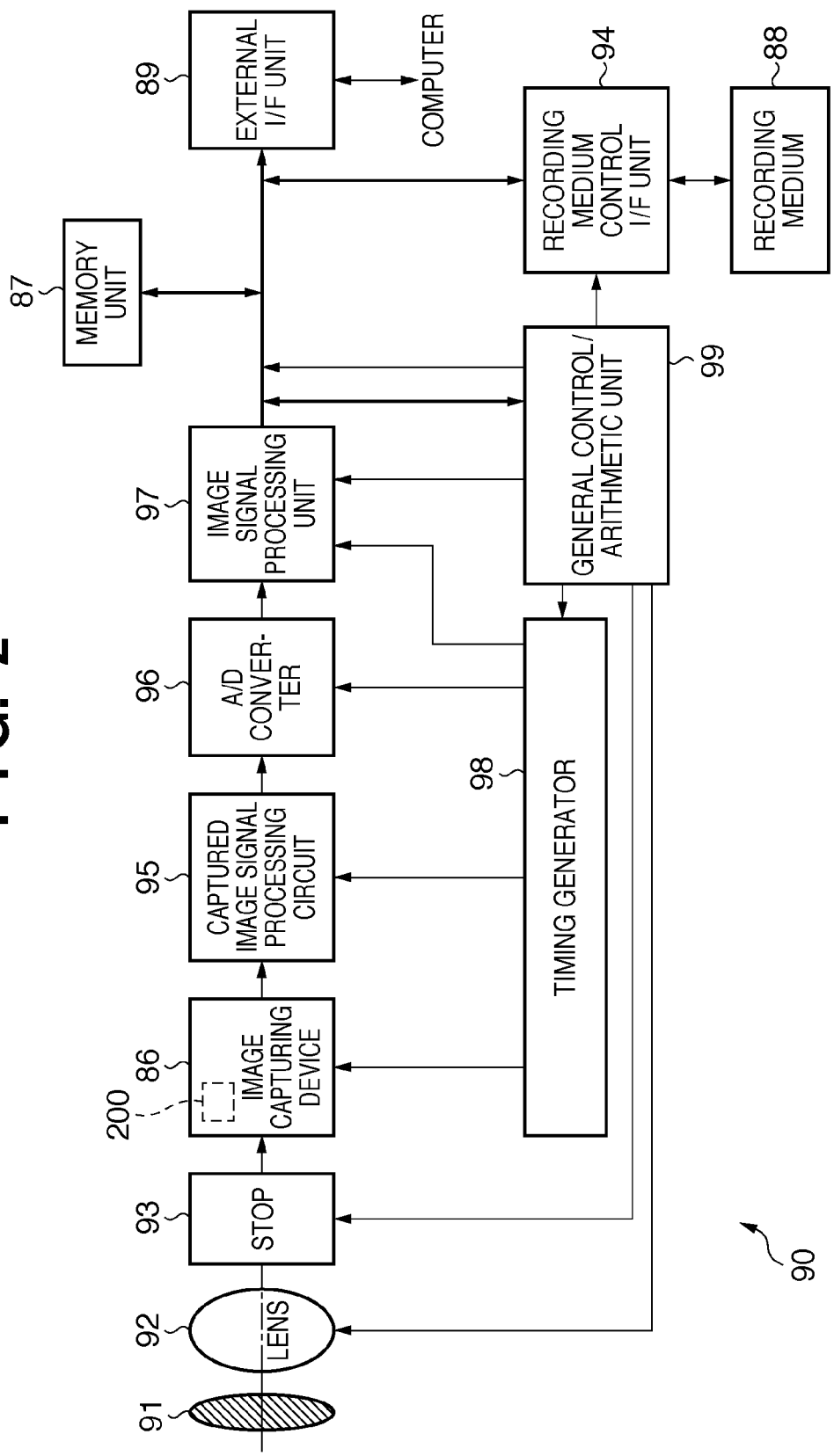
FIG. 2 is a block diagram showing the arrangement of an image capturing system using the photoelectric conversion device according to the embodiment.

FIG. 2 illustrates an example of an image capturing system using the photoelectric conversion device of the present invention.

As shown in FIG. 2, an image capturing system 90 mainly includes an optical system, image capturing device 86, and signal processing unit. The optical system mainly includes a shutter 91, imaging lens 92, and stop 93. The image capturing device 86 includes the photoelectric conversion device 200. The signal processing unit mainly includes a captured image signal processing circuit 95, A/D converter 96, image signal processing unit 97, memory unit 87, external I/F unit 89, timing generator 98, general control/arithmetic unit 99, recording medium 88, and recording medium control I/F unit 94. Note that the signal processing unit need not always include the recording medium 88.

The shutter 91 is provided on the optical path in front of the imaging lens 92 to control exposure.

The imaging lens 92 refracts incident light and forms an object image on the imaging plane of the photoelectric conversion device 200 in the image capturing device 86.

The stop 93 is provided on the optical path between the imaging lens 92 and the photoelectric conversion device 200 to adjust the amount of light that has passed through the imaging lens 92 and is guided to the photoelectric conversion device 200.

The photoelectric conversion device 200 in the image capturing device 86 converts the object image formed on the imaging plane of the photoelectric conversion device 200 into an image signal. The image capturing device 86 outputs the image signal read out from the photoelectric conversion device 200.

The captured image signal processing circuit 95 is connected to the image capturing device 86 to process the image signal output from the image capturing device 86.

The A/D converter 96 is connected to the captured image signal processing circuit 95 to convert the processed image signal (analog signal) output from the captured image signal processing circuit 95 into a digital signal.

The image signal processing unit 97 is connected to the A/D converter 96 to perform arithmetic processing such as various kinds of correction for the image signal (digital signal) output from the A/D converter 96, thereby generating image data. The image data is supplied to the memory unit 87, external I/F unit 89, general control/arithmetic unit 99, recording medium control I/F unit 94, and the like.

The memory unit 87 is connected to the image signal processing unit 97 to store the image data output from the image signal processing unit 97.

The external I/F unit 89 is connected to the image signal processing unit 97. The image data output from the image signal processing unit 97 is transferred to an external device (for example, personal computer) via the external I/F unit 89.

The timing generator 98 is connected to the image capturing device 86, captured image signal processing circuit 95, A/D converter 96, and image signal processing unit 97 to supply timing signals to the image capturing device 86, captured image signal processing circuit 95, A/D converter 96, and image signal processing unit 97. The image capturing device 86, captured image signal processing circuit 95, A/D converter 96, and image signal processing unit 97 operate in synchronism with the timing signals.

The general control/arithmetic unit 99 is connected to the timing generator 98, image signal processing unit 97, and recording medium control I/F unit 94 to generally control the timing generator 98, image signal processing unit 97, and recording medium control I/F unit 94.

The recording medium 88 is detachably connected to the recording medium control I/F unit 94. The image data output from the image signal processing unit 97 is recorded in the recording medium 88 via the recording medium control I/F unit 94.

The above-described arrangement enables to obtain a high-quality image (image data) if a high-quality image signal is obtained by the photoelectric conversion device 200.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-137719, filed Jun. 8, 2009, which is hereby incorporated by reference herein in its entirety.

What is claimed is:

1. A method of manufacturing a photoelectric conversion device, the method comprising:
   a step of forming a first insulating film on a semiconductor substrate;
   a step of forming a gate electrode on the first insulating film with an electrically conductive material such that the first insulating film includes a first portion which is not covered by the gate electrode and a second portion which is covered by the gate electrode;
   a step of forming a charge accumulation region of a photoelectric converter by implanting impurity ions of a first conductivity type into the semiconductor substrate through the first portion of the first insulating film;
   a step of removing the first portion after the step of forming a charge accumulation region;
   a step of forming a second insulating film by oxidation such that the second insulating film covers the semiconductor substrate; and
   a step of forming a surface region of the photoelectric converter by implanting impurity ions of a second conductivity type opposite to the first conductivity type into the semiconductor substrate through the second insulating film.

2. The method according to claim 1, wherein the first insulating film is made of silicon oxide and the second insulating film is made of silicon oxide.

3. The method according to claim 1, wherein, in the step of forming a second insulating film, the second insulating film is formed by thermal oxidation or radical oxidation.

4. The method according to claim 1, wherein, in the step of forming a charge accumulation region, a plurality of charge accumulation regions are formed.

5. The method according to claim 1, wherein the second insulating film is thicker than the first portion.

6. The method according to claim 1, wherein in the step of removing the first portion, the first portion is removed using a chemical solution.

7. The method according to claim 1, wherein, in the step of forming a charge accumulation region, implanting the impurity ions of the first conductivity type is performed at a tilt angle such that a part of the charge accumulation region is arranged under the gate electrode.

8. The method according to claim 1, wherein, in the step of forming a surface region, implanting the impurity ions of the second conductivity type is performed at a tilt angle from an upper side of the gate electrode toward the charge accumulation region.

9. The method according to claim 1, wherein, in the step of forming a charge accumulation region, a part of the charge accumulation region is formed under the gate electrode.

10. The method according to claim 1, wherein, in the step of forming a surface region, the surface region is formed so as to apart from an edge of the gate electrode.

11. The method according to claim 1, further comprising, after the step of forming a surface region, a step of forming an anti-reflection film above the photoelectric converter.

12. The method according to claim 1, wherein the step of forming a gate electrode includes:
    forming an electrically conductive layer with the electrically conductive material:
    forming a mask on the electrically conductive layer: and
    etching the electrically conductive layer using the mask such that a region of the first insulating layer around the gate electrode is exposed and the first portion is formed by the region.

13. The method according to claim 12, wherein the etching the electrically conductive layer includes thinning the region.

* * * * *